United States Patent [19]
Toyoda et al.

[11] Patent Number: 5,986,316
[45] Date of Patent: Nov. 16, 1999

[54] SEMICONDUCTOR TYPE PHYSICAL QUANTITY SENSOR

[75] Inventors: Inao Toyoda; Yasutoshi Suzuki, both of Okazaki; Nobukazu Oba, Gamagori; Hiroaki Tanaka, Nukata-gun, all of Japan

[73] Assignee: Denso Corporation, Kariya, Japan

[21] Appl. No.: 08/979,705

[22] Filed: Nov. 26, 1997

[51] Int. Cl.$^6$ .......................... H01L 29/06; H01L 41/00; G01L 9/06
[52] U.S. Cl. .......................... 257/419; 257/420; 257/627; 257/730; 257/794; 73/727
[58] Field of Search .................... 257/415, 417, 257/418, 419, 420, 627, 730, 794; 73/727

[56] References Cited

U.S. PATENT DOCUMENTS

| | | | |
|---|---|---|---|
| 5,150,616 | 9/1992 | Kondo et al. | |
| 5,259,248 | 11/1993 | Ugai | 73/727 |
| 5,583,295 | 12/1996 | Nagase et al. | 73/727 |
| 5,587,601 | 12/1996 | Kurtz | 257/419 |
| 5,604,363 | 2/1997 | Ichihashi | |
| 5,698,785 | 12/1997 | Rich | 257/419 |

FOREIGN PATENT DOCUMENTS

| | | | |
|---|---|---|---|
| 55-19864 | 2/1980 | Japan | |
| 58-26237 | 2/1983 | Japan | |
| 59-102131 | 6/1984 | Japan | |
| 59-127876 | 7/1984 | Japan | 257/420 |
| 62-148828 | 7/1987 | Japan | |
| 63-241326 | 10/1988 | Japan | |
| 6-186104 | 7/1994 | Japan | |

OTHER PUBLICATIONS

IEEE Transactions on Electron Devices, vol.ED–29, No. 1 Jan. 1982, "A Graphical Re[Resentation of the Piezoresistance Coefficients in Silicon", Yozo Kanda.

*Primary Examiner*—Jerome Jackson, Jr.
*Attorney, Agent, or Firm*—Pillsbury Madison & Sutro, LLP

[57] ABSTRACT

A diffusion gauge is formed in a surface of a silicon substrate which has a plane orientation of (110). The diffusion gauge is disposed so that a main current thereof flows along a <110> direction perpendicular to a direction in which large stress biased in one direction generates in the surface of the silicon substrate due to distortion of a base for fixing the silicon substrate. Therefore, even when the large biased stress generates in the surface of the silicon substrate, because the <110> direction in which the main current of the diffusion gauge flows is perpendicular to the direction in which the biased stress generates, there is a little change in a resistance value of the diffusion gauge. As a result, a detection error caused by the distortion of the base can be reduced.

31 Claims, 5 Drawing Sheets

SEMICONDUCTOR TYPE PHYSICAL QUANTITY SENSOR

CROSS REFERENCE TO RELATED APPLICATION

This application is based upon and claims the benefit of priority of prior Japanese Patent Applications No. H.8-318208 filed on Nov. 28, 1996 and No. H. 8-328792 filed on Dec. 9, 1996, the contents of which are incorporated by reference.

BACKGROUND OF THE INVENTION

1. Field of the Invention

The present invention relates to a semiconductor type physical quantity sensor which can be used as, for example, a pressure sensor for detecting an intake pressure of an engine in an automobile.

2. Description of Related Art

FIG. 9 shows the constitution of a conventional semiconductor type pressure sensor. A diaphragm 1a is formed in a silicon substrate (sensor chip) 1. The diaphragm 1a is displaced in accordance with pressure applied thereto. A plurality of diffusion gauges (strain gauges) 2 are formed on a surface of the diaphragm 1a. Resistance values of the diffusion gauges 2 vary in correspondence to displacement of the diaphragm 1a. The silicon substrate 1 is bonded to a glass pedestal 3 by anodic-bonding. A vacuum chamber 4 is formed between the silicon substrate 1 and the glass pedestal 3. As a result, the diaphragm 1a is displaced in accordance with a differential pressure between pressure applied to an upper surface of the diaphragm 1a and pressure in the vacuum chamber 4. A unit including the silicon substrate 1 bonded to the glass pedestal 3 constitutes a sensing unit 5. The glass pedestal 3 is soldered on a base 6, such as a metal stem, with the result that the sensing unit 5 is mounted on the base 6.

In the constitution as described above, when the base 6 is formed from a resin material for example, the base 6 is likely to be deformed. If the base 6 is cramped at right and left side-faces (A and A' faces) in the figure and is not cramped at front and rear faces (B and B' faces) in the figure, the base 6 is deformed as shown in FIG. 10 on the basis of its thermal expansion. That is, the base 6 is greatly distorted in an X direction rather than in a Y direction as shown in FIG. 10. The distortion of the base 6 is transmitted to the silicon substrate 1 via the glass pedestal 3. As a result, large stress is generated in the X direction on the surface of the silicon substrate 1. When the diffusion gauges 2 formed on the surface of the silicon substrate 1 detect such stress biased in one direction, a detection error in the detecting operation of the diffusion gauges 2 occurs.

SUMMARY OF THE INVENTION

It is an object of the present invention to provide a semiconductor type physical quantity sensor which, even when stress biased in one direction is generated in the surface of a silicon substrate due to a distortion of a base, can reduce a detection error caused thereby as much as possible.

In order to achieve the above-described object, according to the present invention, a diffusion gauge is formed in a surface of a silicon substrate which has a plane orientation of (110). The diffusion gauge is disposed so that a main current thereof flows along a <110> direction perpendicular to a direction in which large stress biased in one direction generates due to distortion of a base for fixing the silicon substrate. Therefore, even when the large biased stress generates in the surface of the silicon substrate due to the distortion of the base, because the <110> direction in which the main current of the diffusion gauge flows is perpendicular to the direction in which the large biased stress generates, there is substantially no change in a resistance value of the diffusion gauge. As a result, a detection error caused by the distortion of the base can be reduced.

BRIEF DESCRIPTION OF THE DRAWINGS

These and other objects, features, and characteristics of the present invention will be appreciated from a study of the following detailed description, the appended claims, and drawings, all of which form a part of this application. In the drawings:

DETAILED DESCRIPTION OF THE PREFERRED EMBODIMENTS

Figure 1:
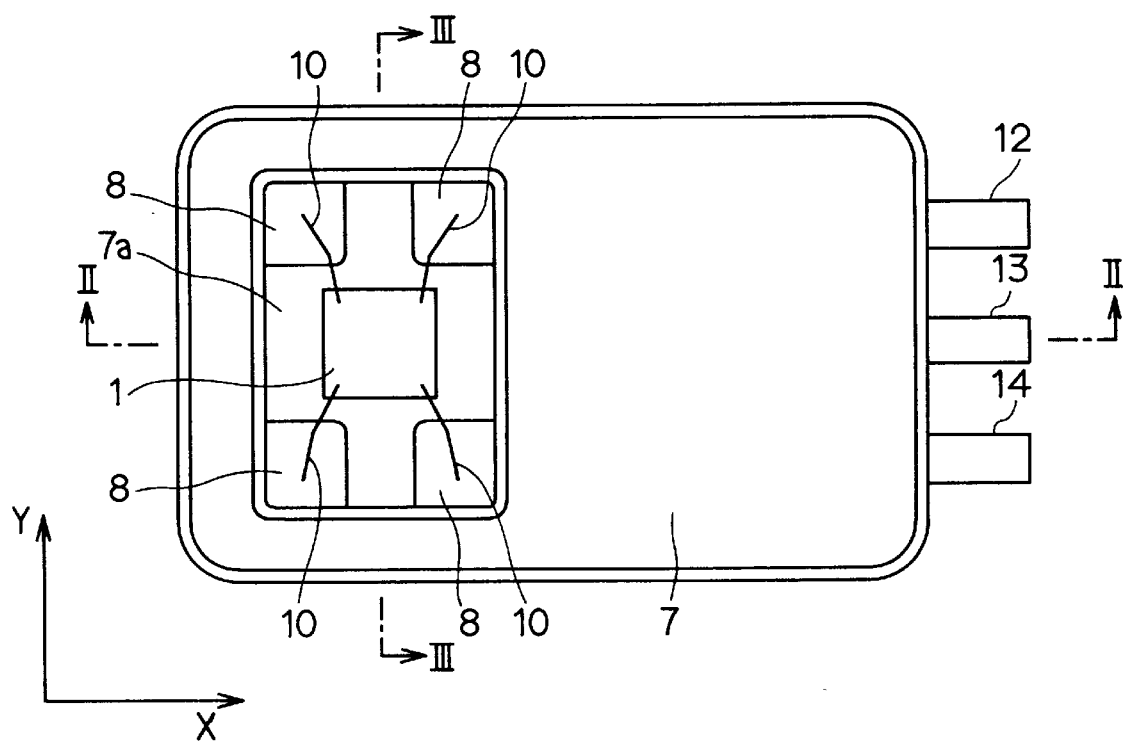
FIG. 1 is a plane view of a semiconductor type pressure sensor according to a first embodiment of the present invention.
Figure 2:
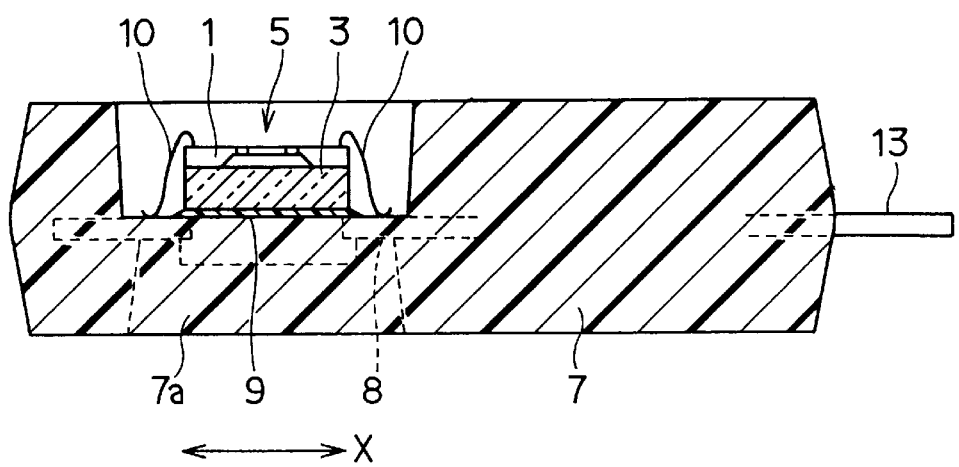
FIG. 2 is a sectional view taken from a line II—II in FIG. 1.
Figure 3:
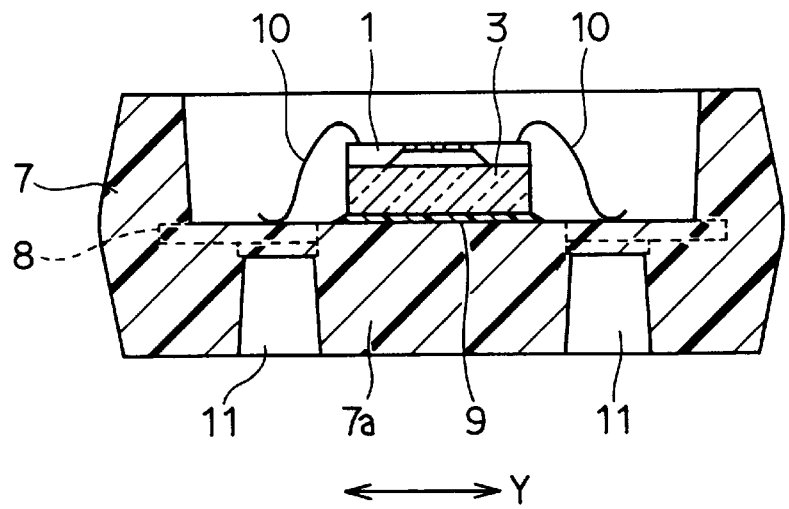
FIG. 3 is a sectional view taken along a line III—III in FIG. 1.
Figure 4:
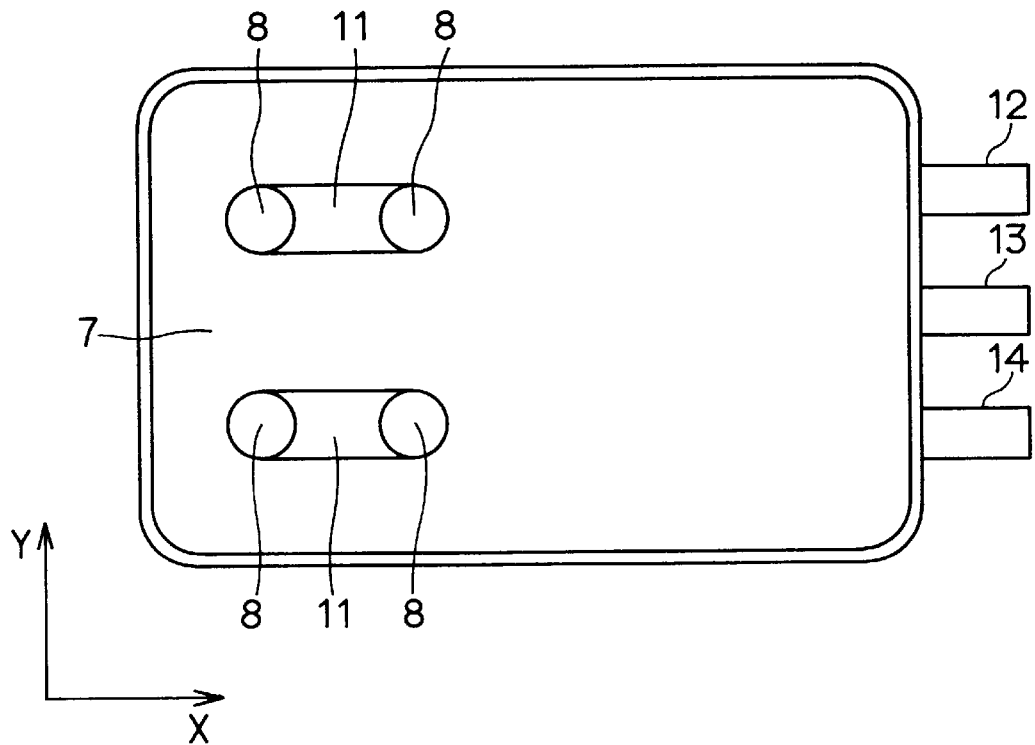
FIG. 4 is a rear view of the semiconductor type pressure sensor according to the first embodiment.

FIG. 1 through FIG. 4 show the constitution of a semiconductor type pressure sensor according to a first embodiment. FIG. 1 is a plane view thereof, FIG. 2 is a sectional view taken from a line II—II in FIG. 1, FIG. 3 is a sectional view taken along a line III—III in FIG. 1 and FIG. 4 is a rear view thereof.

Figure 9:
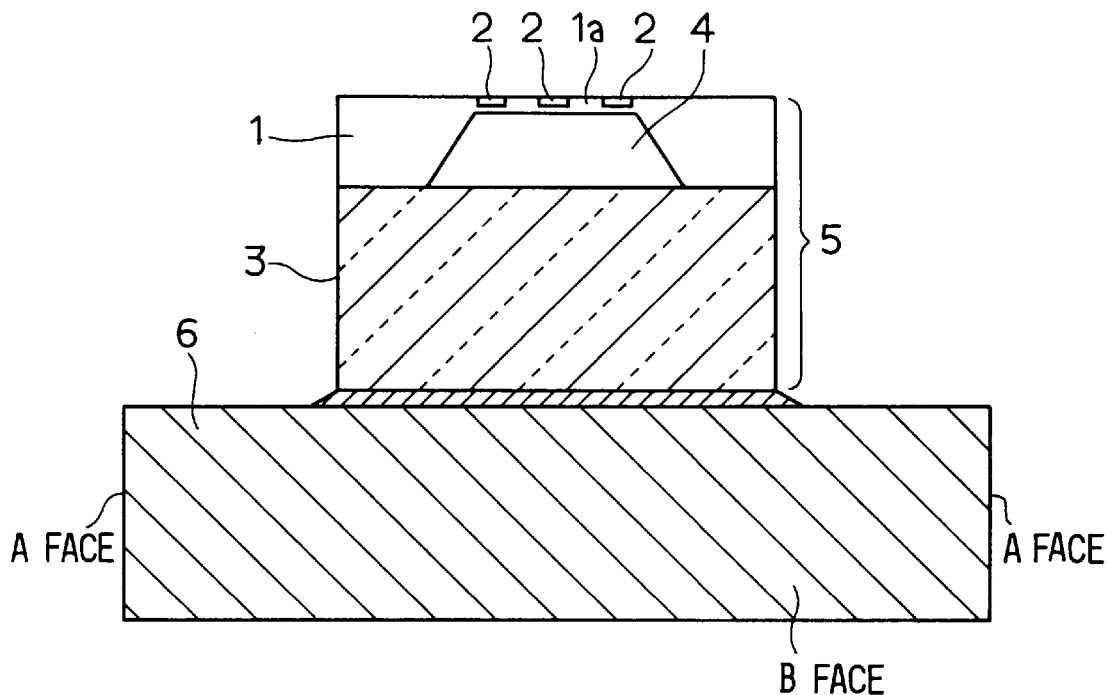
FIG. 9 is a sectional view of a conventional semiconductor type pressure sensor.
Figure 10:
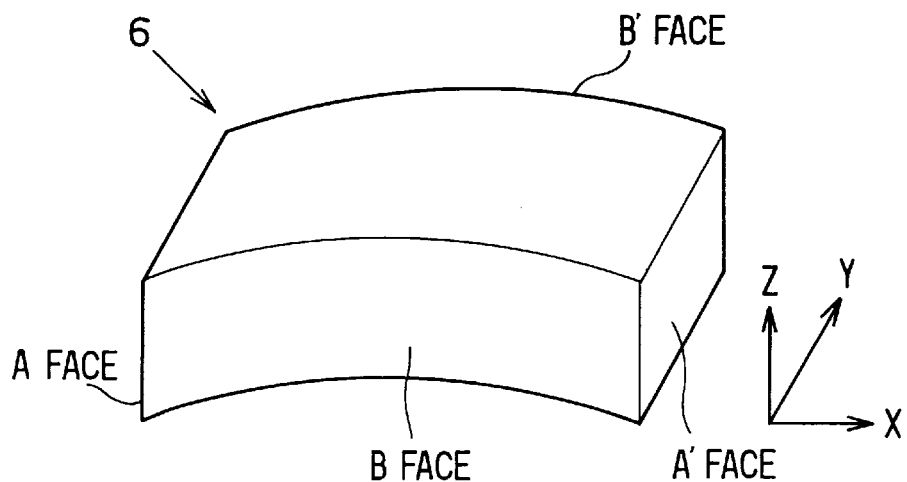
FIG. 10 is a view used to describe the object of the present invention.

The semiconductor type pressure sensor according to the first embodiment is used as an intake pressure sensor for an engine of an automobile which has a sensing unit 5 similar to that shown in FIG. 9 and is constituted as a mold IC. A base 7a on which the sensing unit 5 is mounted is formed by a part of a molding member (resin block) 7 of the mold IC. That is, the sensing unit 5 is mounted on the base 7a which is a part of the resin block 7 in which lead frames 8 are insert-molded with epoxy resin. A glass pedestal 3 of the sensing unit 5 is fixedly adhered onto the base 7a by a silicon group resin adhesive agent 9.

Figure 5:
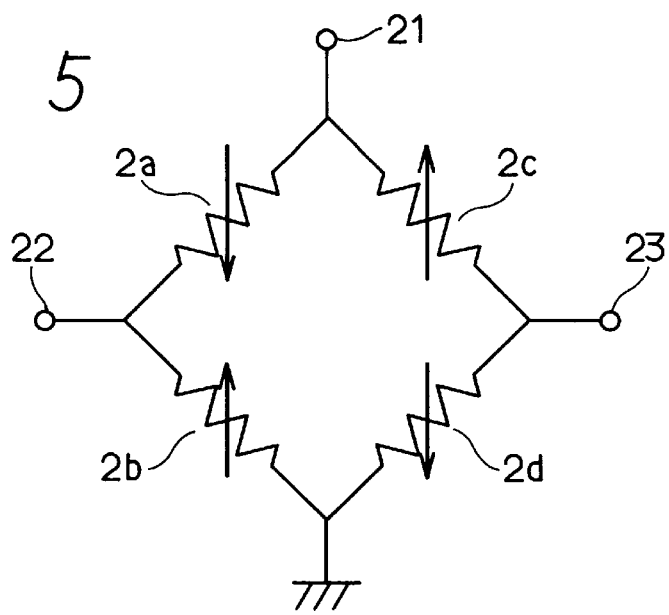
FIG. 5 is a view showing a bridge circuit constituted by diffusion gauges 2a to 2d.
Figure 6:
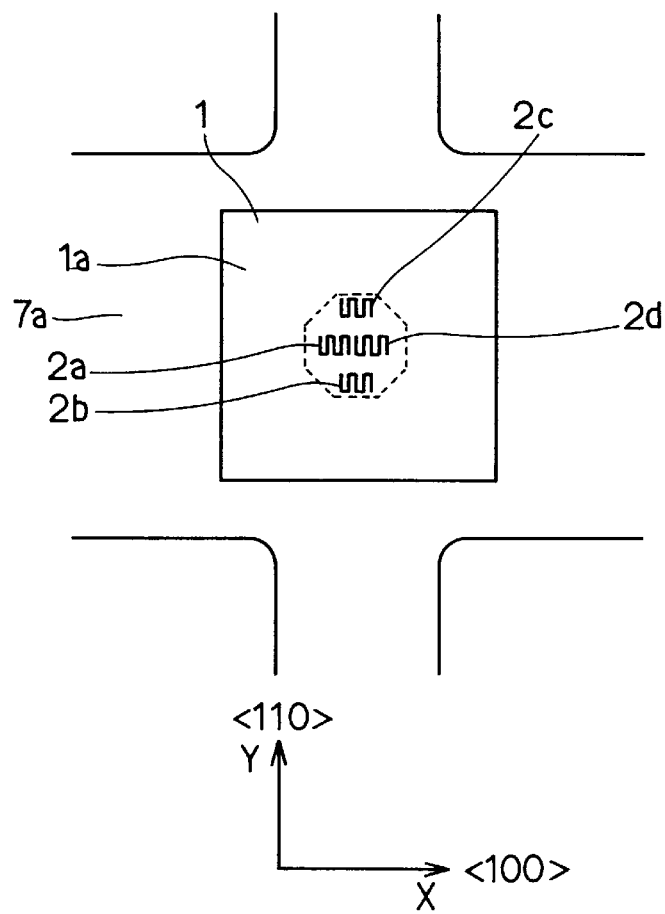
FIG. 6 is a top plane view of a silicon substrate 1.

The diffusion gauges 2 formed on the surface of the silicon substrate 1 are electrically connected to the lead frames 8 by a wiring pattern of an aluminum thin film, not illustrated, that is formed on the silicon substrate 1 and the bonding wires 10. There are formed four diffusion gauges 2a to 2d in a diaphragm 1a on the surface of the silicon substrate 1. The diffusion gauges 2a to 2d are connected to form a bridge circuit as shown in FIG. 5. Each of diffusion gauges 2a to 2d has a longer section and a shorter section which are repeatedly connected at right angle as shown in FIG. 6. A width of the shorter section is wider than that of the longer section. Therefore, the resistance value of the shorter section is smaller than that of the longer section. The diffusion gauges 2a and 2d are disposed in the center of the diaphragm 1a and the diffusion gauges 2b and 2c are disposed in the periphery thereof as shown in FIG. 6. Because the central portion of the diaphragm 1a is different in magnitude of displacement from the peripheral portion thereof, the diffusion gauges 2a to 2d are connected in the bridge circuit so that the direction of change of the resistance values of the diffusion gauges 2a and 2d is opposed to the direction of change of resistance values of the diffusion gauges 2b and 2c as shown by arrows in FIG. 5.

When current flows from a terminal 21 to the diffusion gauges 2a to 2d, a voltage difference in correspondence to pressure applied to the diaphragm 1a is generated between terminals 22 and 23. This voltage difference is amplified by a signal processing circuit provided on the lead frames 8, which is not shown in the figures. The amplified voltage difference is outputted as a sensor signal. The signal processing circuit is electrically connected to three external terminals 12, 13 and 14 which are a power source terminal, a sensor signal output terminal, and a ground terminal, respectively.

The mold IC is formed by molding the resin block 7 with epoxy region while the lead frame 8 is cramped by upper and lower dies. At that time, a recessed portion is formed in the resin block 7 on an upper side of the lead frame 8 by a projection extending from the upper die. The bottom face of the recessed portion is the upper face of the base 7a. The lead frame 8 is exposed in the recessed portion to secure wire-bonding area. However, if the epoxy resin enters the gap between the projection from the upper die and the lead frame 8 during molding of the resin block 7, wire-bonding can not be carried out to the lead frame 8. Therefore, projections extending from the lower die are also formed corresponding to the wire-bonding area of the lead frame 8 so that the projection from the upper die and the projections from the lower die firmly sandwich the lead frame 8. As a result, good wire-bonding area can be obtained on the lead frame 8. It is to be noted that the projections extending from the lower die have short portions which do not reach the lead frame 8 and long portions which extend from the both ends of the short portions and reach the lead frame 8. The short portions of the projections provide resistance to a flow of resin in molding the resin block 7. Due to this, resistance to the resin flow can be provided by both projections of the upper and lower dies. As a result, a cavity formed between the upper and lower dies can be uniformly filled with resin.

Opening portions 11 are created in the resin block 7 on a lower side of the lead frame 8 due to the projections extending from the lower die. Because the opening portions 11 created by the short portions of the projection from the lower die extend along an X direction as shown in FIG. 4, the strength of cramping the base 7a is stronger in the X direction than in a Y direction perpendicular to the X direction. Therefore, when the base 7a is distorted due to its thermal expansion, the base 7a is greatly distorted in the X direction rather than in a Y direction as having shown in FIG. 8. The distortion of the base 7a is transmitted to the silicon substrate 1 via the glass pedestal 3. As a result, large stress is generated in the X direction on the surface of the silicon substrate 1.

According to the present embodiment, the silicon substrate 1 having a plane orientation of (110) is used. In addition, all of the diffusion gauges 2a to 2d are formed on the surface of the diaphragm 1a so that the main current thereof flows along a <110> direction as shown in FIG. 6. It is to be noted that because each of the diffusion gauges 2a to 2d has the longer portion and the shorter portion, the main current flows through the longer portions of the diffusion gauges 2a to 2d. The <110> direction is set to the Y direction, that is, a direction perpendicular to the X direction in which large stress generates in the silicon substrate 1 due to the distortion of the base 7a. When the silicon substrate 1 having the plane orientation of (110) is used and each of the diffusion gauges 2a to 2d is disposed so that the main current thereof flows along the <110> direction, although the resistance values of the diffusion gauges 2a to 2d change responsive to the change of stress occurring in the Y direction due to the piezo resistance effect, there is substantially no change of the resistance values of the diffusion gauges 2a to 2d even when the stress occurs in a <100> direction (the X direction). That is, in the above arrangement, the diffusion gauges 2a to 2b are insensitive (dead) to the change of stress occurring in the X direction. Therefore, when the diaphragm 1a is displaced due to pressure of medium to be detected, the resistance values of the diffusion gauges 2a to 2d change substantially only responsive to the displacement thereof in the Y direction. An accurate pressure detection can be carried out based on such changes of the resistance values of the diffusion gauges 2a to 2d. Even when large stress generates in the X direction on the surface of the silicon substrate 1 due to the distortion of the base 7a, because there is substantially no change of resistance values of the diffusion gauges 2a to 2d in response to the stress occurring in the X direction, detection error caused by the distortion of the base 7a can be minimized.

Figure 7:
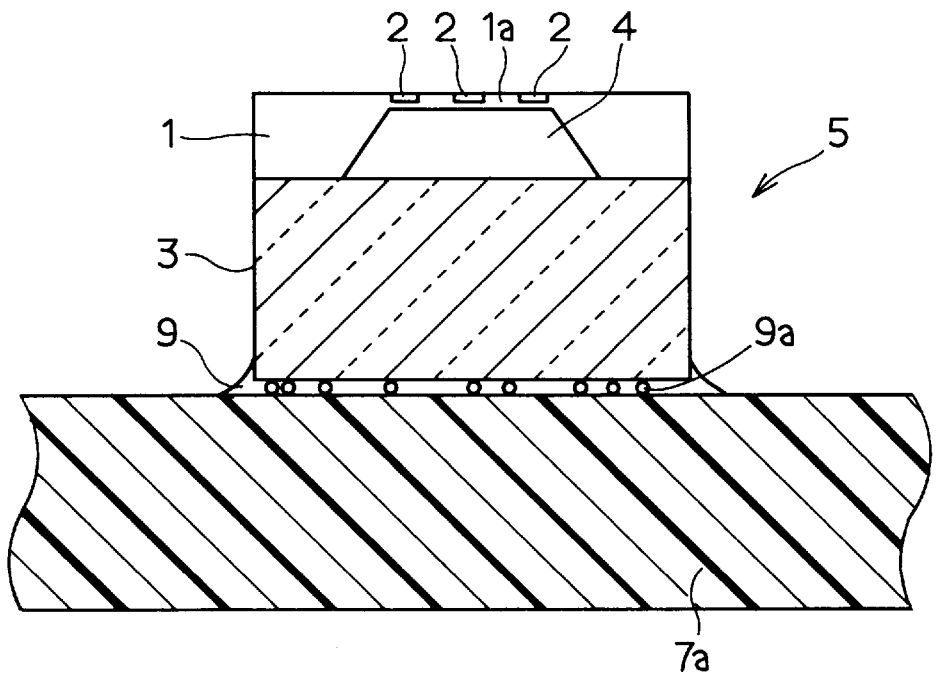
FIG. 7 is a sectional view showing the detailed structure of the semiconductor type pressure sensor according to the first embodiment.

Next, the detailed structure of the sensing unit 5 will be described with reference to FIG. 7.

A diaphragm 1a is formed in a silicon substrate (sensor chip) 1. A plurality of diffusion gauges (strain gauges) 2 are formed on a surface of the diaphragm 1a to detect the displacement of the diaphragm 1a. The silicon substrate 1 is bonded to a glass pedestal 3 by anodic-bonding. The glass pedestal 3 is made of alumina silicic acid group material and has a height of 0.7 mm. A vacuum chamber 4 is formed between the silicon substrate 1 and the glass pedestal 3. As a result, the diaphragm 1a is displaced in accordance with a deferential pressure between pressure applied to the upper surface of the diaphragm 1a and pressure in the vacuum chamber 4. The glass pedestal 3 is adhered on a base 7a of a resin block 7 by a resin adhesive agent 9. The resin block 7 is made of epoxy resin and has a thermal expansion coefficient of 14 ppm/°C. The adhesive agent 9 is an silicon group agent of which elastic strength is 0.6 MPa. Because the elastic strength of the adhesive agent 9 is low and therefore it is difficult that a desired thickness of the adhesive agent 9 is secured between the glass pedestal 3 and the base 7a, micro beads 9a formed from divinylbensene are mixed in the adhesive agent 9. The reason why the desired thickness of the adhesive agent 9 should be secured is to reduce the stress occurring in the silicon substrate 1 due to thermal distortion of the base 7a.

Figure 8:
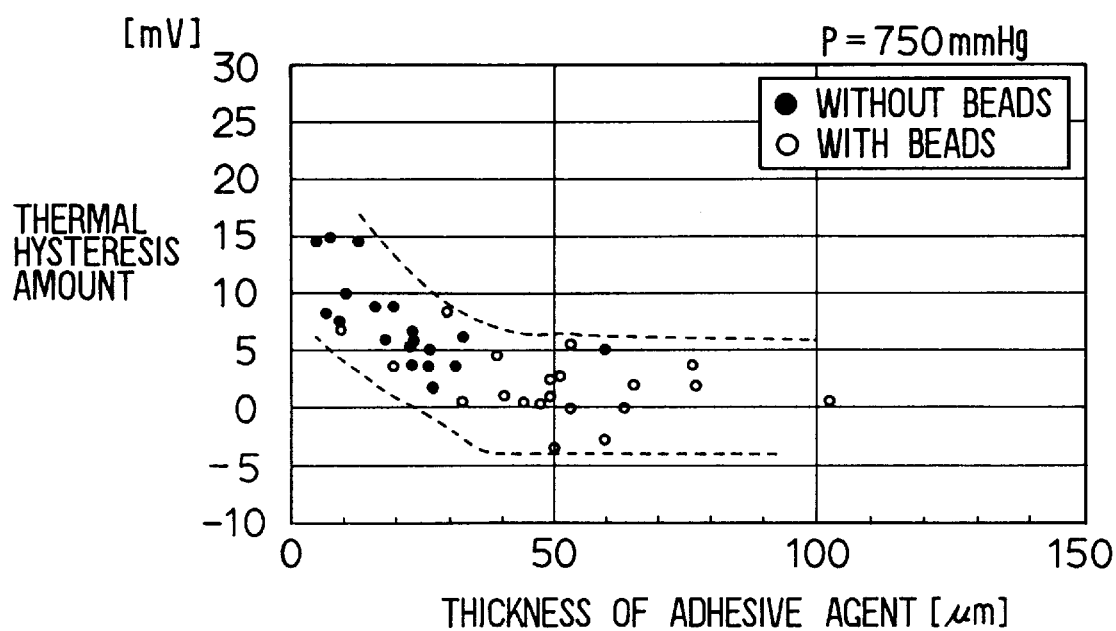
FIG. 8 is a graph showing a relationship between a thickness of an adhesive agent and thermal hysteresis amount.

FIG. 8 shows a result of detecting a thermal hysteresis amount when the thickness of the adhesive agent 9 is varied. The thermal hysteresis is a phenomenon cause by a creeping characteristic of an adhesive agent or a resin material. That is, when the temperature of the adhesive agent or the resin material is increased and then returned to the initial value, the adhesive agent or the resin material does not promptly recover its original state and it takes a certain time period to get the original state. This phenomenon is called thermal hysteresis. Because an influence of this thermal hysteresis to a sensor output is not in correspondence to temperature change of a sensor, it is very difficult to cancel an error caused by such a thermal hysteresis by a signal processing unit.

The thermal hysteresis amount shown in FIG. 8 was derived by detecting an initial value of a sensor output at a room temperature (25° C.), exposing the sensing unit to a high temperature (120° C.) during two hours, detecting a second value of the sensor output when the temperature of the sensor is lowered to the room temperature (25° C.) (two hours are spent for the change of the temperature), and calculating a difference between the initial value and the second value. In this case, a current of 0.74 mA is caused to flow from the terminal 21 in FIG. 5 and the sensor output is obtained by amplifying a voltage difference between the terminals 22 and 23 by the signal processing circuit. Due to the amplification, the sensor output is about 220 times the voltage difference between the terminals 22 and 23. Further, a pressure applied to the diaphragm 1a is a constant value of 750 mmHg.

It is apparent from FIG. 8 that the thermal hysteresis amount can be stably reduced when the thickness of the adhesive agent 9 is set to 40 μm or more. It is to be noted that black circles represent cases in which micro beads 9a are not mixed in the adhesive agent 9, and white circles represent cases in which micro beads 9a are mixed in the adhesive agent 9. The diameter of the micro bead 9a is 50 μm or more to secure the thickness of the adhesive agent 9 of 40 μm or more.

When the thickness of the adhesive agent 9 is caused to 40 μm or more, an influence of thermal distortion of the base 7a to the glass pedestal 3 can be remarkably reduced. For this reason, because a height of the glass pedestal 3 does not need to be heighten, the size of the sensing unit 5 can be made small. In fact, it has been confirmed that the same result as described above was obtained when the height of the glass pedestal 3 is shortened from 0.7 mm to 0.5 mm. It is to be noted that the upper limit of the thickness of the adhesive agent 9 is not specified and the thickness of the adhesive agent 9 can be determined to 40 μm or more if there is no problem in practical use. Further, although the silicon group adhesive agent 6 of which elastic strength is 0.6 MPa is used in the above-mentioned embodiment, when an adhesive agent of which elastic strength is equal to or lower than 1 MPa is used, it is conceivable that the same effect as described above can be obtained.

The present invention is not limited to the above-described embodiment, and can be modified in various ways within a scope of the appended claims. For example, depending on the material forming the base 7a, there is a case where the distortion of the base 7a in the X direction is different from that in the Y direction. Specifically, when the material in which glass fiber is inserted in a material including a single component is used as a material to form a base in order to improve the mechanical strength of the base, a thermal expansion coefficient in a direction parallel to a material flowing direction along which the material flows in the cavity between upper and lower dies is different from a thermal expansion coefficient in a direction perpendicular to the material flowing direction. Due to this, a direction along which distortion is small and a direction along which distortion is large are defined in the base. In this case, the diffusion gauges are disposed so that the main currents thereof flow in the direction along which the thermal expansion coefficient is small. As a result, a detection error caused by the distortion of the base can be lowered.

Further, as a constitution of the sensing unit 5, the medium for pressure to be detected may be introduced in a chamber inside the diaphragm 1a through a hole penetrating the glass pedestal 3. The pedestal 3 is not limited to be made of glass and may be made of silicon. In some cases, the pedestal 3 can be dispensed with. Materials other than the materials as described above can be used for the base 7a and the adhesive agent to adhere the pedestal 3 onto the base 7a.

What is claimed is:

1. A semiconductor type physical quantity sensor comprising:

a sensing unit having a silicon substrate, a diaphragm, formed in said silicon substrate, which is displaced by physical quantity applied thereto, and a diffusion gauge, formed in a surface of said silicon substrate, of which resistance value varies in response to displacement of said diaphragm, wherein said physical quantity is detected based on said resistance value of said diffusion gauge when current flows through said diffusion gauge; and a base on which said sensing unit is mounted, said base causing stress in a first direction on the surface of said silicon substrate larger than stress in a second direction perpendicular to said first direction when said base is distorted, wherein said silicon substrate has a plane orientation of (110), and said diffusion gauge is disposed in the surface of said silicon substrate so that main current thereof flows in a <110> direction perpendicular to said first direction in which large stress occurs.

2. A semiconductor type physical quantity sensor according to claim 1, wherein said sensing unit has a pedestal for fixing said silicon substrate, said base is made of resin material, and said pedestal is adhered onto said base by a resin adhesive agent.

3. A semiconductor type physical quantity sensor according to claim 1, wherein said base is clamped in said first direction more strongly than in said second direction.

4. A semiconductor type physical quantity sensor according to claim 1, wherein said base is formed from a material by which a thermal expansion coefficient in said first direction is different from a thermal expansion coefficient in said second direction.

5. A semiconductor type physical quantity sensor according to claim 1, wherein said diffusion gauge has a plurality of longer sections and a plurality of shorter section which are repeatedly connected, and said diffusion gauge is disposed so that a longitudinal direction of said longer sections becomes said <110> direction.

6. A semiconductor type physical quantity sensor according to claim 1, further comprising:

a lead frame; and a resin block in which said lead frame is insert-molded, said resin block having a recessed portion in one surface thereof, wherein said sensing unit is mounted on a bottom face of said recessed portion.

7. A semiconductor type physical quantity sensor according to claim 6, wherein said resin block has an opening portion in another surface thereof at a position corresponding to said recessed portion, whereby said lead frame interposes between said recessed portion and said opening portion.

8. A semiconductor type physical quantity sensor according to claim 6, wherein said lead frame is exposed to said recessed portion, and said sensing unit and said lead frame are electrically connected by wire-bonding.

9. A semiconductor type physical quantity sensor according to claim 6, wherein said opening portion has a shallow portion which does not reach said lead frame and a deep portion which reaches said lead frame.

10. A semiconductor type physical quantity sensor according to claim 9, wherein two shallow portions are formed on said another surface of said resin block, each of said two shallow portions has an approximately rectangular shape, and said two shallow portions are disposed so as to be in parallel to two sides of said sensing unit which are opposed to each other.

11. A semiconductor type physical quantity sensor according to claim 2, wherein said resin adhesive agent has a thickness of 40 μm or more.

12. A semiconductor type physical quantity sensor according to claim 2, wherein said resin adhesive agent is a silicon group agent.

13. A semiconductor type physical quantity sensor according to claim 12, wherein said silicon group agent has an elastic strength of 1 MPa or less.

14. A semiconductor type physical quantity sensor according to claim 2, further comprising substance to secure the thickness of said resin adhesive agent is included therein.

15. A semiconductor type physical quantity sensor according to claim 14, wherein said substance is beads.

16. A semiconductor type physical quantity sensor comprising:
    a sensing unit having a silicon substrate, a diaphragm formed in said silicon substrate, said diaphragm being displaceable by a physical quantity applied thereto, and a diffusion gauge formed in a surface of said silicon substrate, wherein resistance value of said diffusion gauge varies in response to displacement of said diaphragm, wherein said physical quantity is detected based on said resistance value of said diffusion gauge when current flows through said diffusion gauge; and
    a base on which said sensing unit is mounted, said base causing stress in a first direction on the surface of said silicon substrate larger than stress in a second direction perpendicular to said first direction when said base is distorted,
    wherein said diffusion gauge has a longer section and a shorter section, and said diffusion gauge is arranged in the surface of said silicon substrate with said longer section extending in said second direction so that said diffusion gauge is insensitive to said stress occurring in said first direction.

17. A semiconductor type physical quantity sensor according to claim 16, wherein said sensing unit has a pedestal for fixing said silicon substrate, said base is made of resin material, and said pedestal is adhered onto said base by a resin adhesive agent.

18. A semiconductor type physical quantity sensor comprising:
    a sensing unit having a silicon substrate, a diaphragm formed in said silicon substrate, said diaphragm being displaceable by a physical quantity applied thereto, and a diffusion gauge formed in a surface of said silicon substrate, wherein resistance value of said diffusion gauge varies in response to displacement of said diaphragm, wherein said physical quantity is detected based on said resistance value of said diffusion gauge when current flows through said diffusion gauge; and
    a base on which said sensing unit is mounted, said base causing stress in a first direction on the surface of said silicon substrate larger than stress in a second direction perpendicular to said first direction when said base is distorted,
    wherein said diffusion gauge is arranged in the surface of said silicon substrate so that said diffusion gauge is insensitive to said stress occurring in said first direction, and, wherein said base is clamped in said first direction more strongly than in said second direction.

19. A semiconductor type physical quantity sensor according to claim 16, wherein said base is formed from a material by which a thermal expansion coefficient in said first direction is different from a thermal expansion coefficient in said second direction.

20. A semiconductor type physical quantity sensor comprising:
    a sensing unit having a silicon substrate, a diaphragm formed in said silicon substrate, said diaphragm being displaceable by a physical quantity applied thereto, and a diffusion gauge formed in a surface of said silicon substrate, wherein resistance value of said diffusion gauge varies in response to displacement of said diaphragm, wherein said physical quantity is detected based on said resistance value of said diffusion gauge when current flows through said diffusion gauge; and
    a base on which said sensing unit is mounted, said base causing stress in a first direction on the surface of said silicon substrate larger than stress in a second direction perpendicular to said first direction when said base is distorted,
    wherein said diffusion gauge has a longer section and a shorter section, and said diffusion gauge is arranged in the surface of said silicon substrate with said longer section extending in said second direction,
    wherein said silicon substrate has a plane orientation of (110), and said diffusion gauge has a plurality of longer sections and a plurality of shorter sections which are repeatedly connected at right angles, and said diffusion gauge is disposed so that a longitudinal direction of said longer sections becomes a <110> direction which is perpendicular to said first direction.

21. A semiconductor type physical quantity sensor according to claim 16, further comprising:
    a lead frame; and
    a resin block in which said lead frame is insert-molded, said resin block having a recessed portion in one surface thereof,
    wherein said sensing unit is mounted on a bottom face of said recessed portion.

22. A semiconductor type physical quantity sensor according to claim 21, wherein said resin block has an opening portion in another surface thereof at a position corresponding to said recessed portion, whereby said lead frame interposes between said recessed portion and said opening portion.

23. A semiconductor type physical quantity sensor according to claim 21, wherein said lead frame is exposed to said recessed portion, and said sensing unit and said lead frame are electrically connected by wire-bonding.

24. A semiconductor type physical quantity sensor according to claim 21, wherein said opening portion has a shallow portion which does not reach said lead frame and a deep portion which reaches said lead frame.

25. A semiconductor type physical quantity sensor according to claim 24, wherein two shallow portions are formed on said another surface of said resin block, each of said two shallow portions has an approximately rectangular shape, and said two shallow portions are disposed so as to be in parallel to two sides of said sensing unit which are opposed to each other.

26. A semiconductor type physical quantity sensor according to claim 17, wherein said resin adhesive agent has a thickness of 40 μm or more.

27. A semiconductor type physical quantity sensor according to claim 17, wherein said resin adhesive agent is a silicon group agent.

28. A semiconductor type physical quantity sensor according to claim 27, wherein said silicon group agent has an elastic strength of 1 MPa or less.

29. A semiconductor type physical quantity sensor according to claim 17, further comprising substance to secure the thickness of said resin adhesive agent is included therein.

30. A semiconductor type physical quantity sensor according to claim 29, wherein said substance is beads.

31. A semiconductor type physical quantity sensor comprising:

a sensing unit having a silicon substrate, a diaphragm formed in said silicon substrate, said diaphragm being displaceable by a physical quantity applied thereto, and a gauge formed in a surface of said silicon substrate, wherein resistance value of said gauge varies in response to displacement of said diaphragm, wherein said physical quantity is detected based on said resistance value of said gauge when current flows through said gauge; and a base on which said sensing unit is mounted, said base causing stress in a first direction on the surface of said silicon substrate larger than stress in a second direction perpendicular to said first direction when said base is distorted, wherein said silicon substrate has a plane orientation of (110), and said gauge is disposed in the surface of said silicon substrate so that main current thereof flows in a <110> direction perpendicular to said first direction in which large stress occurs.

* * * * *